(12) United States Patent
Fujii et al.

(10) Patent No.: US 7,847,340 B2
(45) Date of Patent: Dec. 7, 2010

(54) SEMICONDUCTOR DEVICE AND METHOD FOR MANUFACTURING THE SAME

(75) Inventors: Kenichi Fujii, Aizuwakamatsu (JP); Masatomi Okanishi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 45 days.

(21) Appl. No.: 11/963,400

(22) Filed: Dec. 21, 2007

(65) Prior Publication Data

US 2008/0191321 A1 Aug. 14, 2008

(30) Foreign Application Priority Data

Dec. 27, 2006 (JP) .............................. 2006-353416

(51) Int. Cl.
*H01L 29/792* (2006.01)
*H01L 21/336* (2006.01)

(52) U.S. Cl. ............... 257/324; 257/637; 257/E23.165; 257/E21.21; 257/315; 257/314; 438/591

(58) Field of Classification Search .................. 257/637, 257/E29.165, E21.21; 438/591, 197
See application file for complete search history.

(56) References Cited

U.S. PATENT DOCUMENTS

2005/0214996 A1* 9/2005 Yoshino ....................... 438/197
2006/0240615 A1* 10/2006 Shih ............................. 438/257
2006/0267080 A1* 11/2006 Hayakawa et al. .......... 257/324

* cited by examiner

*Primary Examiner*—N Drew Richards
*Assistant Examiner*—Mamadou Diallo

(57) ABSTRACT

The present invention provides a semiconductor device and a method of manufacturing the semiconductor device, the semiconductor device including: ONO films that are formed on a semiconductor substrate and include trapping layers; word lines that are formed on the ONO films; and silicon oxide layers that are formed at portions on the semiconductor substrate, the portions being located between the word lines, the silicon oxide layers being located between the trapping layers.

6 Claims, 20 Drawing Sheets

SEMICONDUCTOR DEVICE AND METHOD FOR MANUFACTURING THE SAME

TECHNICAL FIELD

This invention relates generally to semiconductor devices and methods for manufacturing the semiconductor devices, and more particularly, to a semiconductor device having a non-volatile memory with an ONO film and a method for manufacturing such semiconductor device.

BACKGROUND OF THE INVENTION

In recent years, data rewritable non-volatile memory semiconductor devices are widely used. For example, in typical non-volatile memories such as flash memories, transistors forming memory cells have floating gates or insulation films that are known as charge storage layers. In such flash memories, charges are accumulated in the charge storage layers to store data. An example of a flash memory having an insulating film as a charge storage layer is a flash memory with a SONOS (Silicon Oxide Nitride Oxide Silicon) structure that stores charges in the trapping layer of an ONO (Oxide/Nitride/Oxide) film. U.S. Pat. No. 6,011,725 discloses a SONOS flash memory with virtual-ground memory cells having interchangeable source and drain, the source and drain operated in a symmetrical fashion.

FIG. 1A is a top view of a conventional flash memory (the ONO film is not shown). FIG. 1B is a cross-sectional view of the conventional flash memory, taken along the line D-D of FIG. 1A. FIG. 1A and FIG. 1B illustrate problems with the conventional flash memory structure. As shown in FIG. 1A and FIG. 1B, bit lines 12 formed with diffusion layers are provided in a semiconductor substrate 10. The bit lines 12 extend in the vertical direction of FIG. 1A. The bit lines 12 also serve as source and drain. An ONO film 20 formed with a tunnel oxide film 14, a trapping layer 16, and a top oxide film 18 is provided on the semiconductor substrate 10. Word lines 22 are provided on the ONO film 20, and extend in the width direction of the bit lines 12 (i.e., the horizontal direction of FIG. 1A). The word lines 22 also serve as gate electrodes.

A voltage is applied between the bit lines 12 (i.e., between the source and drain) when charges are written into the trapping layer 16 of the ONO film 20. The portion of the semiconductor substrate 10 located between each two bit lines 12 below the word lines 22 serves as a channel 44a through which current flows. In FIG. 1A, reference numeral 42 indicates the flow of electrons. The electrons with high energy at the end of the channel on the side of the bit line 12 (the drain) are captured by the trapping layer 16. As a result, a charge storing region C0 is formed. Here, fringing current flows through each region 44b in the semiconductor substrate 10 on either side of the corresponding word line 22. Accordingly, electrons are also captured by the trapping layer 16 on either side of the word line 22, and charge storing regions C1 are formed. The charges accumulated in the charge storing regions C1 cannot be erased. As a result, the charges accumulated in the charge storing regions C1 cause an error when the distance between each two word lines 22 is reduced when reducing the size of each memory cell.

Where portions of the top oxide film 18 located between the word lines 22 are removed during the middle of the manufacturing process, for example, the surface of the trapping layer 16 might be oxidized during a later procedure. As a result, a silicon oxynitride film 46 is formed on each portion of the trapping layer 16 located between the word lines 22, as shown in FIG. 1B. Since the silicon oxynitride film 46 has higher conductivity than the trapping layer 16, which is a silicon nitride film, the electrons captured in the trapping layer 16 move into the silicon oxynitride film 46, thereby reducing the charge writing time.

SUMMARY OF THE INVENTION

The present invention has been made in view of the above circumstances and provides a semiconductor device and a method of manufacturing the semiconductor device, by which the formation of charge storing regions on both sides of each word line and the formation of silicon oxynitride films between the word lines can be prevented.

According to an aspect of the present invention, there is provided a semiconductor device including ONO films formed on a semiconductor substrate and including trapping layers, word lines formed on the ONO films, and silicon oxide layers formed at portions on the semiconductor substrate located between the word lines, the silicon oxide layers being located between the trapping layers. According to this aspect, silicon oxide layers are formed on both sides of the trapping layers below the word lines. Accordingly, the formation of charge storing regions at the sides of the word lines due to a fringing current can be prevented. Also, since the silicon oxide layers are formed between the word lines, the formation of silicon oxynitride films can be prevented.

According to another aspect of the present invention, there is provided a method of manufacturing a semiconductor device including forming ONO films that include trapping layers on a semiconductor substrate, forming word lines on the ONO films, and forming silicon oxide layers by oxidizing portions of the trapping layers located between the word lines. In accordance with this invention, silicon oxide layers are formed on both sides of the trapping layers below the word lines. Accordingly, the formation of charge storing regions at the sides of the word lines due to a fringing current can be prevented. Also, since the silicon oxide layers are formed between the word lines, the formation of silicon oxynitride films can be prevented. Furthermore, the silicon oxide layers can be formed by a simple procedure.

According to yet another aspect of the present invention, there is provided a method of manufacturing a semiconductor device, including forming ONO films that include trapping layers on a semiconductor substrate, forming word lines on the ONO films, removing portions of the trapping layers located between the word lines, and forming silicon oxide layers on portions of the semiconductor substrate located between the word lines. According to this aspect of the present invention, silicon oxide layers are formed on both sides of the trapping layers below the word lines. Accordingly, the formation of charge storing regions at the sides of the word lines due to a fringing current can be prevented. Also, since the silicon oxide layers are formed between the word lines, the formation of silicon oxynitride films can be prevented. Furthermore, oxidization of the end portions of the trapping layers located below the word lines can be prevented thereby inhibiting reduction of the charge storing regions.

DETAILED DESCRIPTION OF THE INVENTION

The following is a description of embodiments of the present invention, with reference to the accompanying drawings.

First Embodiment

Figure 2B:
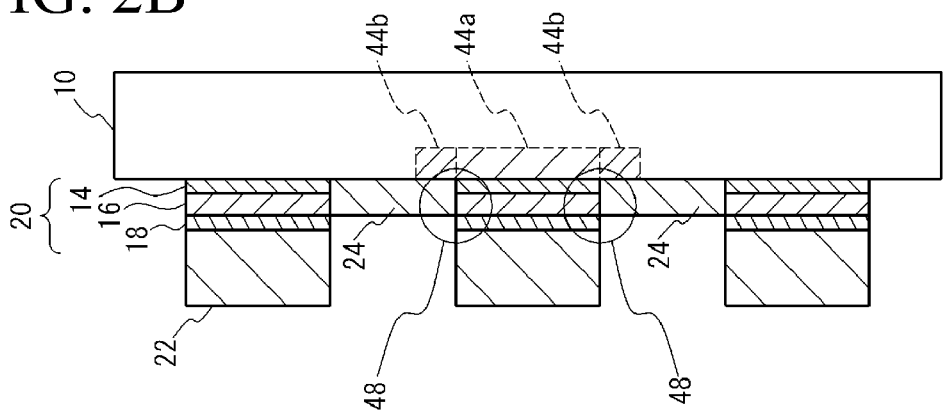
FIG. 2B is a cross-sectional view of the flash memory, taken along the line D-D of FIG. 2A.
Figure 2A:
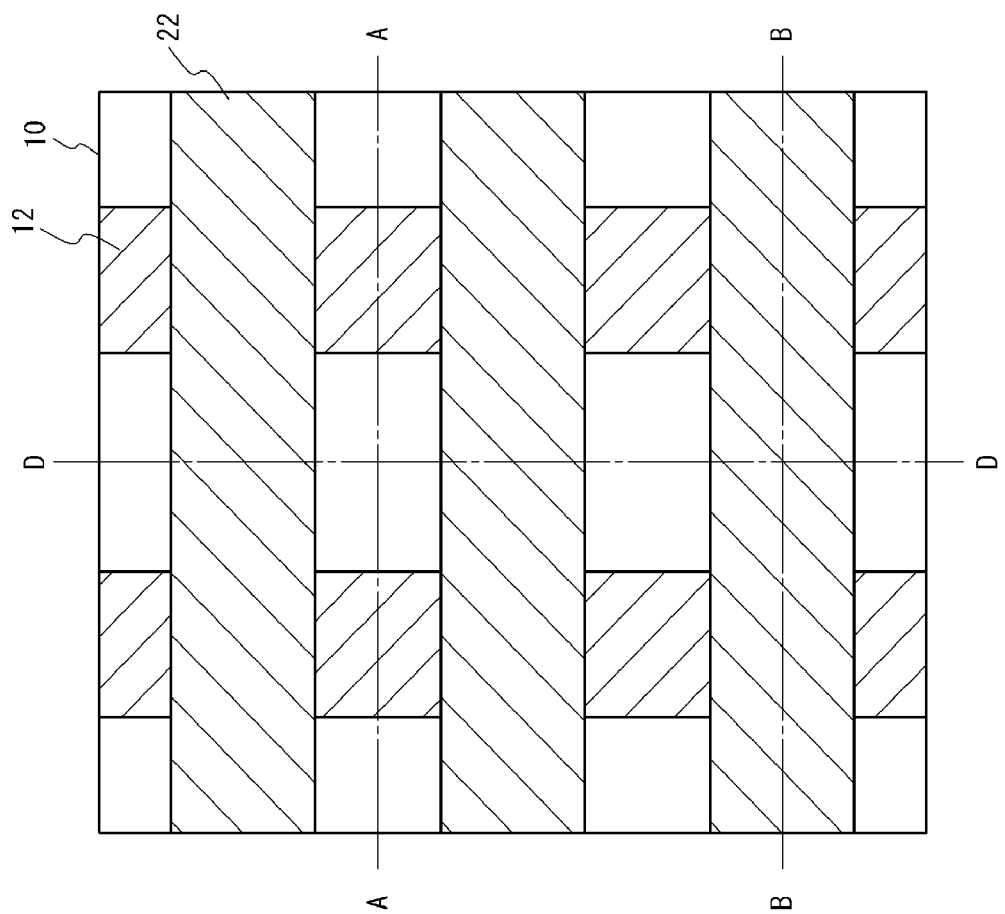
FIG. 2A is a top view of a flash memory in accordance with a first embodiment of the present invention.

FIG. 2A is a plan view of a flash memory in accordance with a first embodiment of the present invention. FIG. 2B is a cross-sectional view of the flash memory in accordance with the first embodiment taken along the line D-D of FIG. 2A. As shown in FIG. 2B, tunnel oxide film 14, trapping layer 16, and top oxide film 18, in this order, form ONO film 20 on a semiconductor substrate 10. Word lines 22 are provided on the ONO films 20. A silicon oxide layer 24 having a film thickness equal to or greater than the film thickness of the tunnel oxide film 14 and the trapping layer 16 of the ONO film 20 is provided between the ONO films 20 on the semiconductor substrate 10 below the word lines 22. As shown in FIG. 2A, the word lines 22 extend in the transverse direction of FIG. 2A. Bit lines 12 extend in the width direction of the word lines 22, and are provided in the semiconductor substrate 10.

Figure 3A:
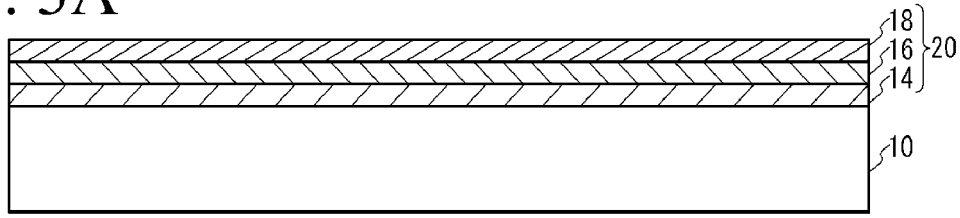
FIGS. 3A through 3D are cross-sectional views illustrating a first half of a procedure for manufacturing the flash memory of FIGS. 2A and 2B in accordance with the first embodiment.
Figure 3B:
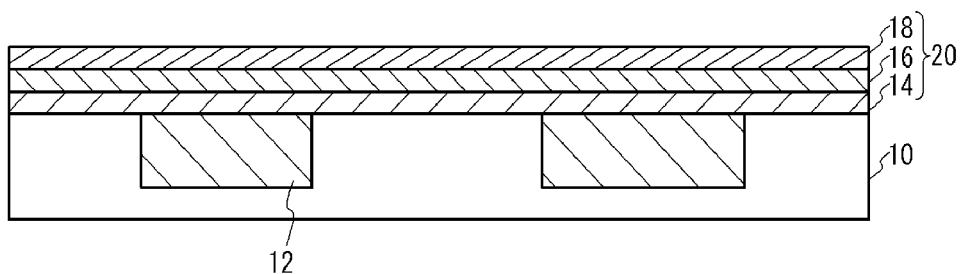
Figure 3C:
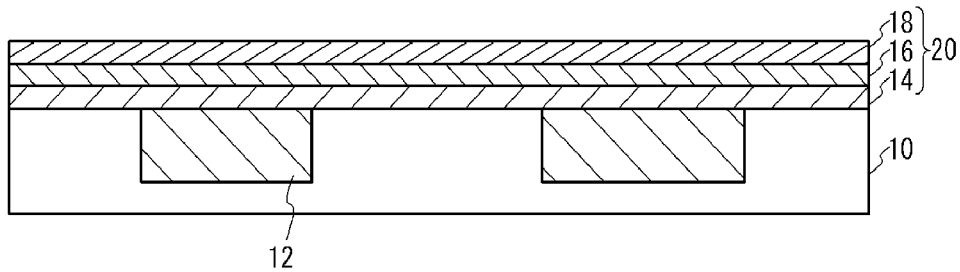
Figure 3D:
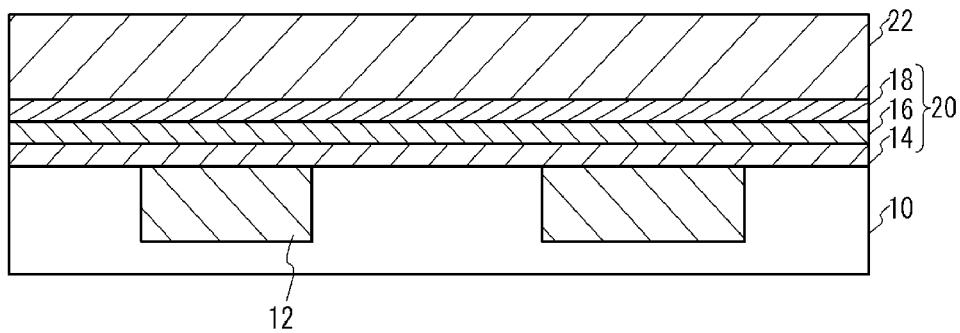
Figure 4A:
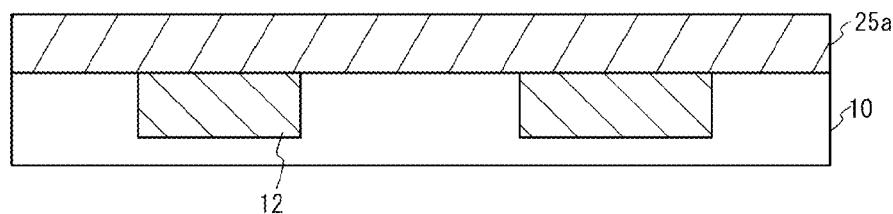
FIGS. 4A through 4D are cross-sectional views illustrating a second half of the procedure for manufacturing the flash memory of FIGS. 2A and 2B in accordance with the first embodiment.
Figure 4B:
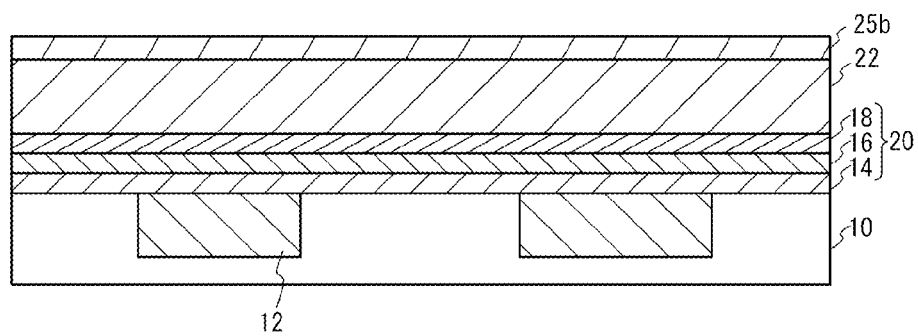
Figure 4C:
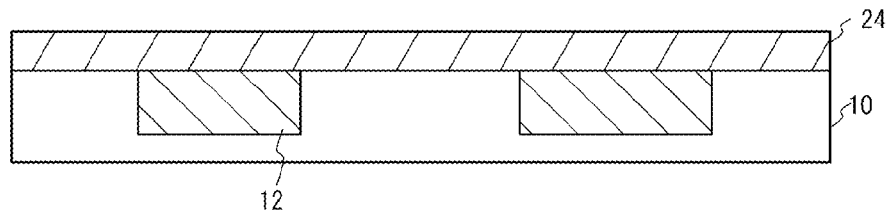
Figure 4D:
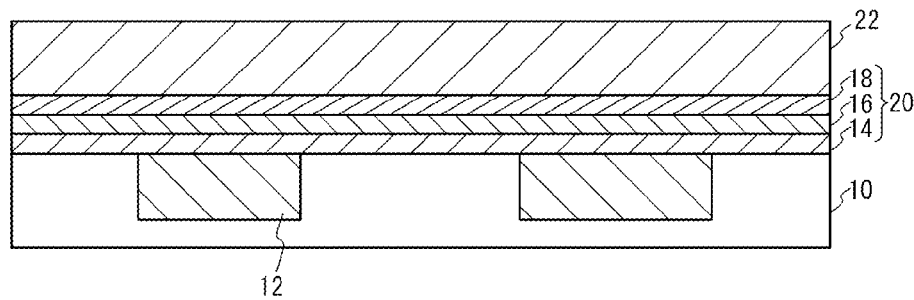

Referring now to FIGS. 3A through 4D, a method of manufacturing the flash memory in accordance with the first embodiment is described. FIGS. 3A and 3B are cross-sectional views, taken along the line A-A and the line B-B of FIG. 2A. FIGS. 3C, 4A, and 4C are cross-sectional views, taken along the line A-A of FIG. 2A, while FIGS. 3D, 4B, and 4D are cross-sectional views, taken along the line B-B of FIG. 2A.

As shown in FIG. 3A, a silicon oxide film is formed on a p-type silicon semiconductor substrate 10 (or on a p-type region in a semiconductor substrate) as a tunnel oxide film 14 by a thermal oxidization technique, a silicon nitride film is formed as a trapping layer 16 by chemical vapor deposition (CVD), and a silicon oxide film is then formed as a top oxide film 18 by CVD, for example. In this manner, an ONO film 20 is formed on the semiconductor substrate 10. As shown in FIG. 3B, arsenic ions, for example, are injected into the semiconductor substrate 10, and heat treatment is carried out to form the bit lines 12 that are n-type diffusion layers in the semiconductor substrate 10. The top oxide film 18 may be formed after the formation of the bit lines 12. As shown in FIGS. 3C and 3D, a polycrystalline silicon film is formed on the ONO film 20. Predetermined portions of the polycrystalline silicon film are removed to form the word lines 22 on the ONO film 20.

As shown in FIGS. 4A and 4B, thermal oxidization is performed on the portions of the trapping layer 16 of the ONO film 20 located between the word lines 22, and thermal oxidization is also performed on the upper portions of the word lines 22. By this manufacturing step, a silicon oxide film 25a is formed between each two word lines 22, as shown in FIG. 4A. The silicon oxide film 25a is integrally formed with the tunnel oxide film 14, a silicon oxide film generated from the oxidized trapping layer 16, and the top oxide film 18. Meanwhile, a silicon oxide film 25b is formed on each word line 22 when part of each word line 22 is oxidized, as shown in FIG. 4B. The film thickness of each silicon oxide film 25a is greater than the film thickness of each silicon oxide film 25b. As shown in FIGS. 4C and 4D, etching is performed on the entire surface of the silicon oxide films 25a and 25b, and the silicon oxide films 25b on the word lines 22 are removed as shown in FIG. 4D. Since the film thickness of each silicon oxide film 25a is greater than the film thickness of each silicon oxide film 25b, the silicon oxide films 25a remain between the word lines 22 as shown in FIG. 4C forming the silicon oxide layers 24. After that, an interlayer insulating film, metal plugs, wiring layers, and the likes are formed to complete the flash memory in accordance with the first embodiment.

Figure 1B:
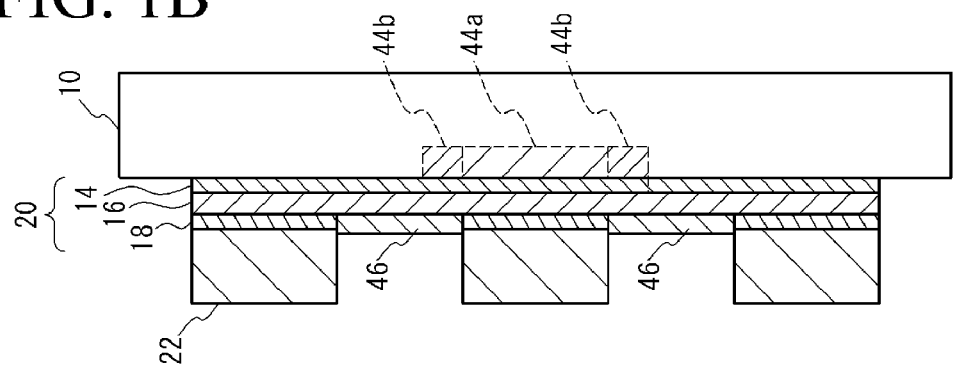
FIG. 1B is a cross-sectional view of the conventional flash memory, taken along the line D-D of FIG. 1A.
Figure 1A:
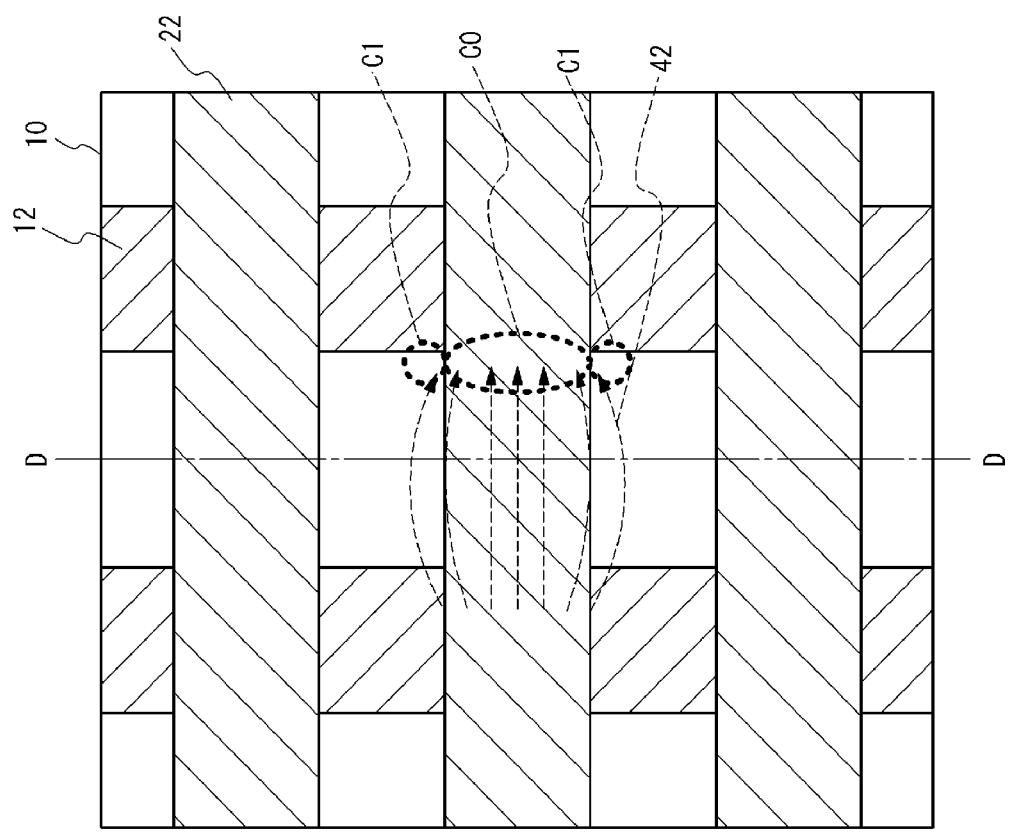
FIG. 1A is a top view of a conventional flash memory.

In accordance with the first embodiment, the silicon oxide layers 24 are formed between the trapping layers 16 on the semiconductor substrate 10, and the silicon oxide layers 24 are located between the word lines 22, as shown in FIG. 2B. Accordingly, even in a case where the channel 44a expands to the regions 44b on both sides of each word line 22 as shown in FIG. 2B, the formation of the charge storing region C1 at both sides of each word line 22 as shown in FIG. 1A can be prevented. Accordingly, each memory cell can be prevented from erroneous operation, even when the distance between each two word lines 22 is reduced. Also, since the silicon oxide layers 24 are formed between the word lines 22, the formation of the silicon oxynitride films 46 shown in FIG. 1B can be prevented.

Further, in accordance with the first embodiment, the trapping layers 16 of the ONO films 20 between the word lines 22 are oxidized to form the silicon oxide layers 24, as shown in FIG. 4A. Accordingly, the silicon oxide layers 24 can be formed through a simplified process, without requiring an additional step to remove the trapping layers 16.

Second Embodiment

Figure 5A:
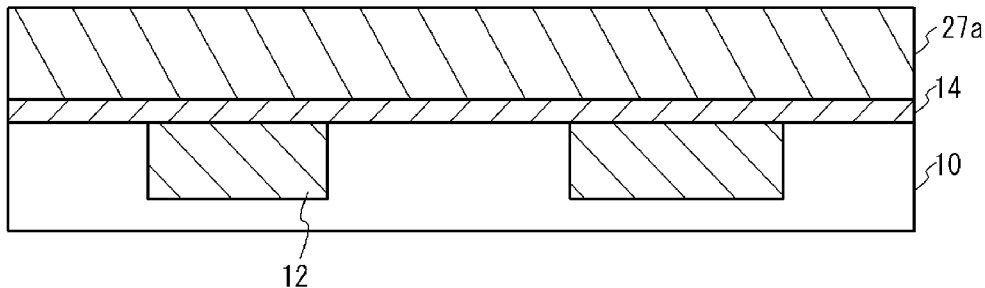
FIGS. 5A through 5D are cross-sectional views illustrating procedures for manufacturing a flash memory in accordance with a second embodiment of the present invention.
Figure 5B:
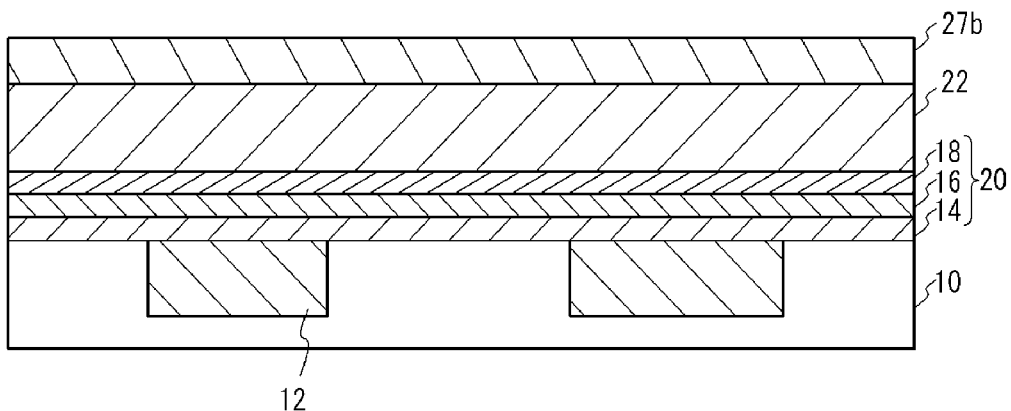
Figure 5C:
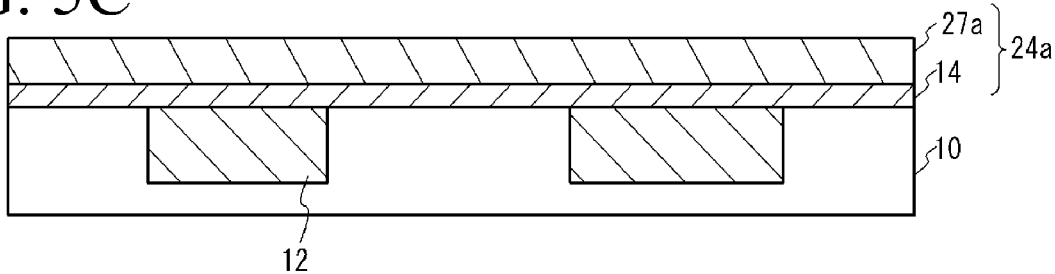
Figure 5D:
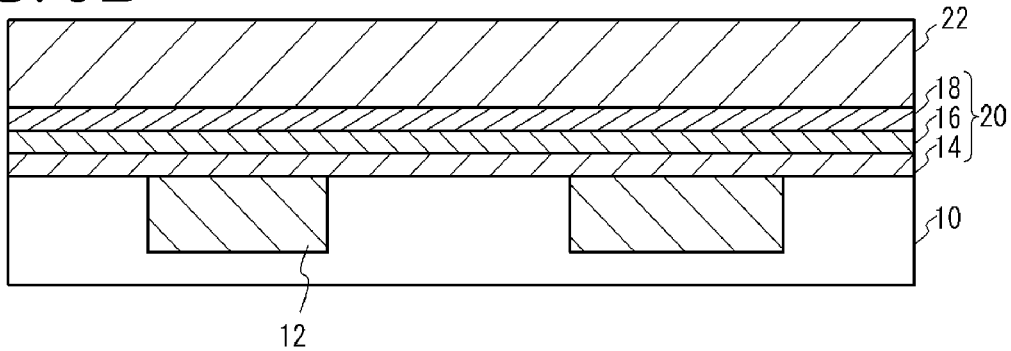

A second embodiment of the present invention is an example case where the portions of the trapping layer 16 of an ONO film 20 located between word lines 22 are removed, and silicon oxide layers are formed. FIGS. 5A through 5D illustrate a method of manufacturing a flash memory in accordance with the second embodiment. FIG. 5A and FIG. 5C are cross-sectional views, taken along the line A-A of FIG. 2A. FIG. 5B and FIG. 5D are cross-sectional views, taken along the line B-B of FIG. 2A.

As shown in FIGS. 5A and 5B, after the manufacturing process steps of the first embodiment shown in FIGS. 3A through 3D are carried out, the portions of the top oxide film 18 and the trapping layer 16 located between the word lines 22 are removed. A Hydrogen Silesquioxane (HSQ) film is then applied and heated to form silicon oxide films 27a and 27b. Since the HSQ film flattens during heating to form the silicon oxide films 27a and 27b, the silicon oxide films 27a between the word lines 22 shown in FIG. 5A are thick, while the silicon oxide films 27b on the word lines 22 shown in FIG. 5B are thin. As shown in FIGS. 5C and 5D, etching is performed on the surfaces of the silicon oxide films 27a and 27b to remove the silicon oxide films 27b on the word lines 22, as shown in FIG. 5D. Since the film thickness of each silicon oxide film 27a is greater than the film thickness of each silicon oxide film 27b, the silicon oxide films 27a remains between the word lines 22, as shown in FIG. 5C. The tunnel oxide films 14 and the remaining silicon oxide films 27a form silicon oxide layers 24a. In this manner, the silicon oxide layers 24a are formed between the word lines 22 above the semiconductor substrate 10, and the silicon oxide layers 24a are also located between the trapping layers 16 below the word lines 22.

In the first embodiment, the trapping layers 16 might be oxidized at the end portions 48 that are located at both side portions of each ONO film 20 and under the word lines 22 shown in FIG. 2B. This is because, when the trapping layers 16 are oxidized, the end portions 48 of the trapping layers 16 below the word lines 22 are also oxidized. As a result, the charge storing regions might become smaller. In the second embodiment, the portions of the trapping layers 16 between the word lines 22 are removed by etching, as shown in FIG. 5A. The silicon oxide layers 24a are then formed between the word lines 22, as shown in FIG. 5C. Accordingly, the trapping layers 16 are not oxidized at the end portions below the word lines 22. Thus, a reduction of the area of each charge storing region can be prevented.

Third Embodiment

Figure 6:
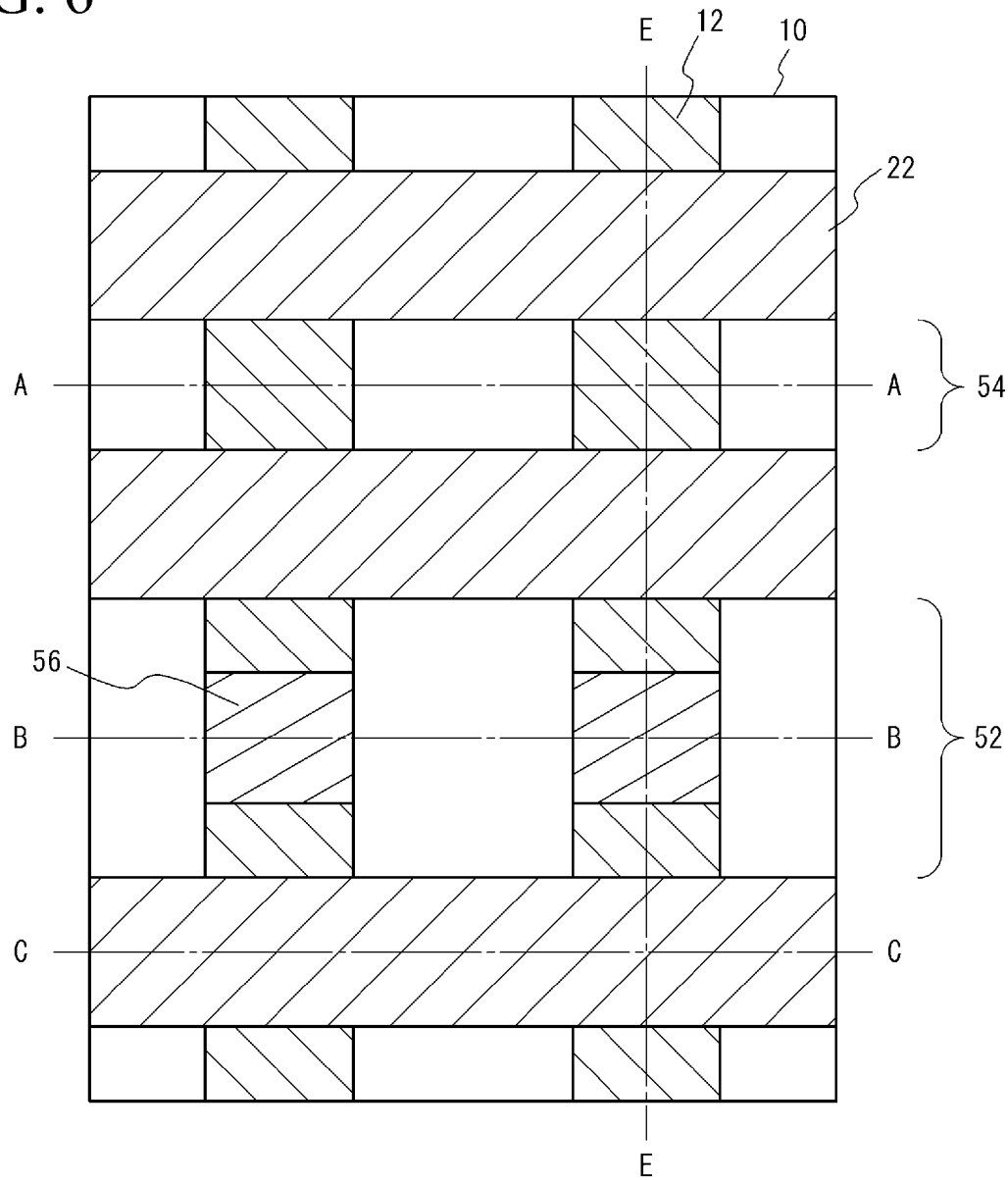
FIG. 6 is a top view of a flash memory in accordance with a third embodiment of the present invention.

A third embodiment of the present invention is an example case where metal silicide layers 40 to be connected to contact holes are provided on the bit lines 12 of the first embodiment. FIG. 6 is a top view of a flash memory in accordance with the third embodiment. FIG. 7A, FIG. 7B, FIG. 7C, and FIG. 7D are cross-sectional views of the flash memory, taken along the line A-A, the line B-B, the line C-C, and the line E-E of FIG. 6.

As shown in FIG. 6, the word lines 22 extend in the transverse direction of FIG. 6. The bit lines 12 extend in the width direction of the word lines 22, and the bit lines 12 are provided in the semiconductor substrate. The bit lines 12 are formed with diffusion layers, and have higher resistance than a metal. Therefore, not to degrade the performance such as data write into a memory cell or data read from a memory cell, the bit lines are connected to one another via wiring layers 36 (shown in FIG. 7) and metal plugs 32 at the interval of few word lines 22. The regions in which the metal plugs 32 are connected to the bit lines 12 are contact regions 56. The regions having the contact regions 56 between the word lines 22 are second inter-wordline regions 52, and the regions not having the contact regions 56 between the word lines 22 are first inter-wordline regions 54.

Figure 7A:
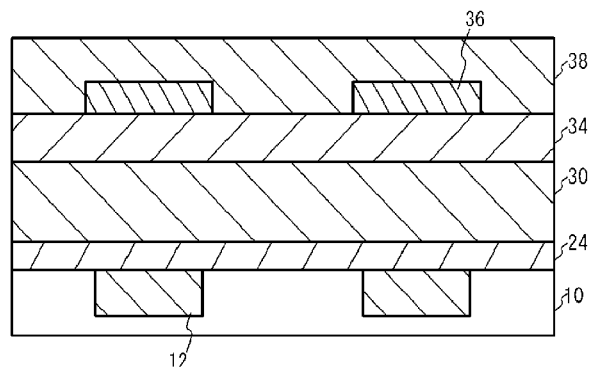
FIGS. 7A, 7B, 7C and 7D are cross-sectional views of the flash memory in accordance with the third embodiment of the present invention taken along the lines A-A, B-B, C-C, and E-E of FIG. 6, respectively.
Figure 7B:
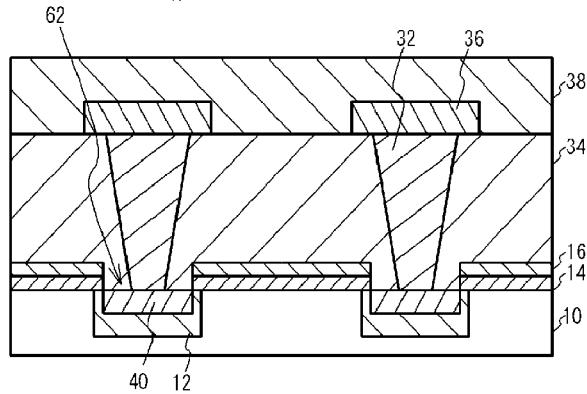
Figure 7C:
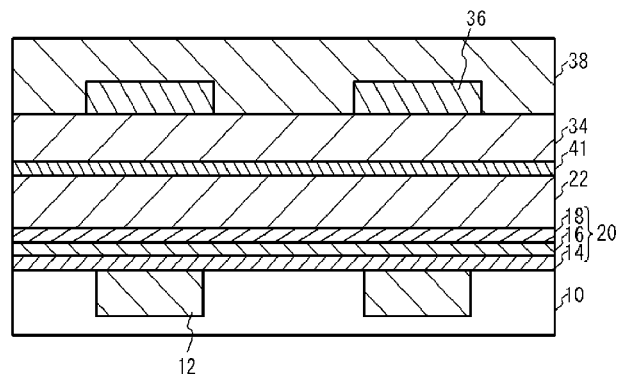

As shown in FIG. 7A, in each of the first inter-wordline regions 54, the bit lines 12 are formed in the semiconductor substrate 10, as in the first embodiment shown in FIG. 4A, and a silicon oxide layer 24 is provided on the semiconductor substrate 10. A second silicon nitride film 30 is provided on the silicon oxide layer 24. As shown in FIG. 7B, in each of the second inter-wordline regions 52, a tunnel oxide film 14 and a trapping layer 16 are provided on the semiconductor substrate 10. There are openings 62 formed in the tunnel oxide film 14 and the trapping layer 16. A metal silicide layer 40 is provided at a portion of each bit line 12 below the openings 62. An interlayer insulating film 34 is provided on the trapping layer 16, and the metal plugs 32 are provided in contact holes formed in the interlayer insulating film 34. Accordingly, the metal silicide layers 40 are provided between the bit lines 12 and the metal plugs 32. The metal plugs 32 connect the metal silicide layers 40 and wiring layers 36. As shown in FIG. 7C, in a cross section taken along a word lines 22, an ONO film 20 is provided on the semiconductor substrate 10, and the word line 22 is provided on the ONO film 20, as in the first embodiment shown in FIG. 4D. A metal silicide layer 41 is provided on the word line 22.

Figure 7D:
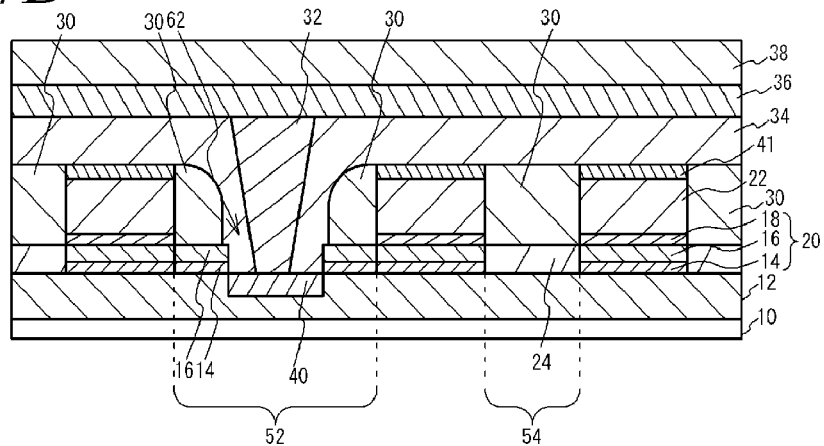

As shown in FIG. 7D, each of the bit lines 12 is formed in the semiconductor substrate 10. The ONO films 20 are formed on the semiconductor substrate 10 (or on the bit lines 12), and the word lines 22 are provided on the ONO films 20. A silicon oxide layer 24 and a second silicon nitride film 30 are provided on the portion of the semiconductor substrate 10 located in each of the first inter-wordline regions 54 between the word lines 22. The upper face of the silicon oxide layer 24 is located at the same level as or at a higher level than the upper face of each trapping layer 16 of the ONO films 20. In this manner, the silicon oxide layer 24 is provided between the trapping layers 16. Here, the upper face of each word line 22 is located at the same level as or at a higher level than the upper face of each second silicon nitride film 30.

In each of the second inter-wordline regions 52, the tunnel oxide film 14 and the trapping layer 16 are provided on the semiconductor substrate 10. The openings 62 are formed in the tunnel oxide film 14 and the trapping layer 16. A metal silicide layer 40 is formed at a portion on each bit line 12 below each corresponding opening 62. Each second silicon nitride film 30 is provided at the side portions of the word lines 22 located above the trapping layer 16. The interlayer insulating film 34 is provided over the word lines 22 and the second silicon nitride film 30. Contact holes are formed in the interlayer insulating film 23, and the metal plugs 32 are formed in the contact holes. The metal plugs 32 between the word lines 22 are connected to the bit lines 12. As shown in FIG. 7A through FIG. 7D, a wiring layer 36 that extends in the same direction as the bit lines 12 are provided on the interlayer insulating film 34. A protection film 38 is provided on the wiring layer 36.

Figure 13A:
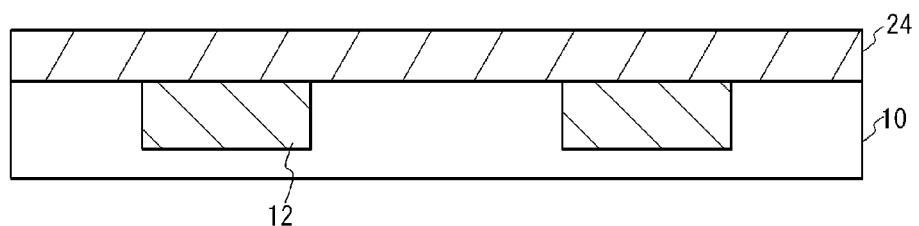
FIGS. 13A through 13C are cross-sectional views illustrating a sixth procedure in the process for manufacturing the flash memory of FIG. 6 in accordance with the third embodiment.
Figure 13B:
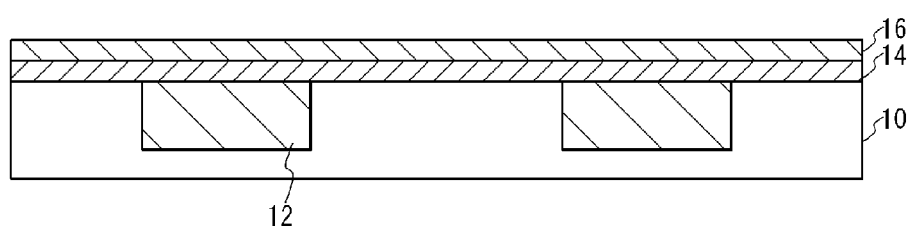
Figure 13C:
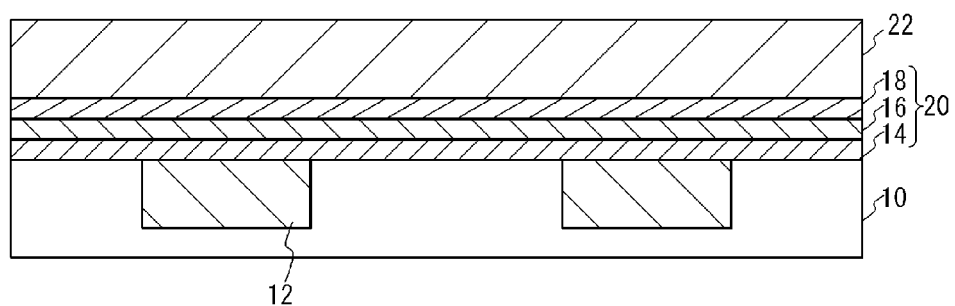
Figure 14A:
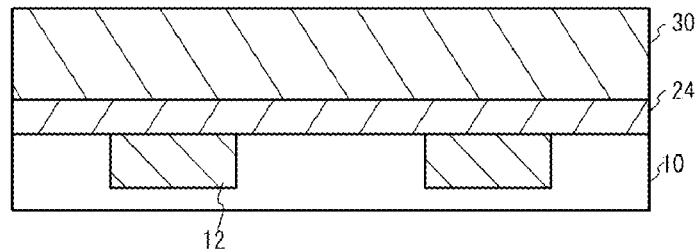
FIGS. 14A through 14D are cross-sectional views illustrating a seventh procedure in the process for manufacturing the flash memory of FIG. 6 in accordance with the third embodiment.
Figure 14B:
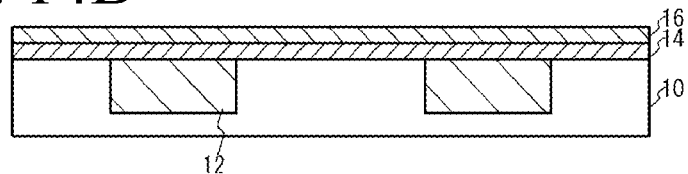
Figure 14C:
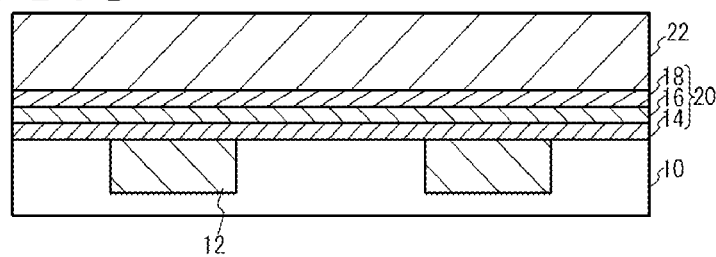
Figure 14D:
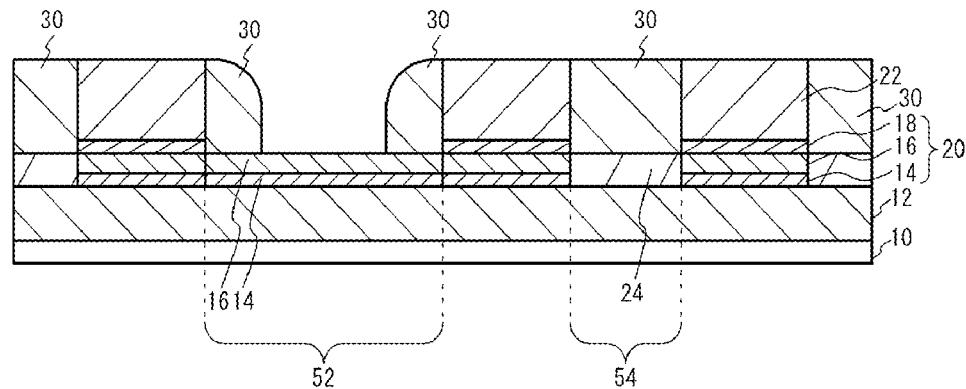
Figure 15A:
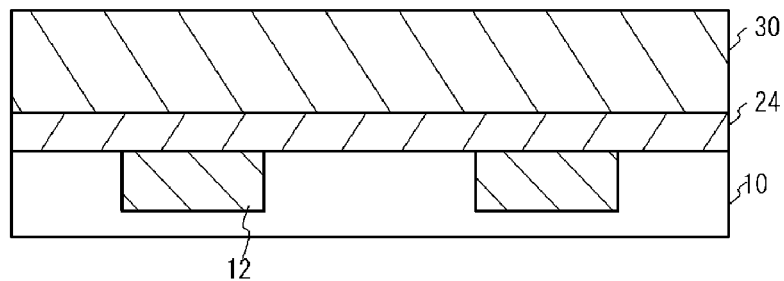
FIGS. 15A through 15D are cross-sectional views illustrating an eighth procedure in the process for manufacturing the flash memory of FIG. 6 in accordance with the third embodiment.
Figure 15B:
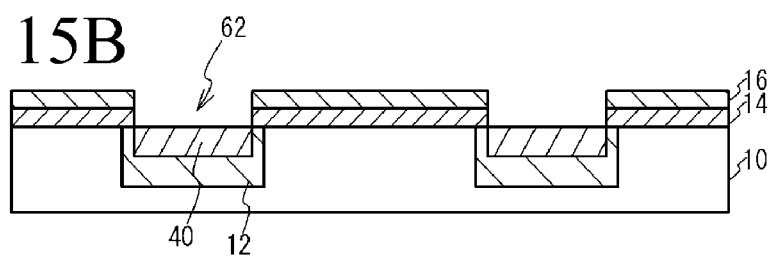
Figure 15C:
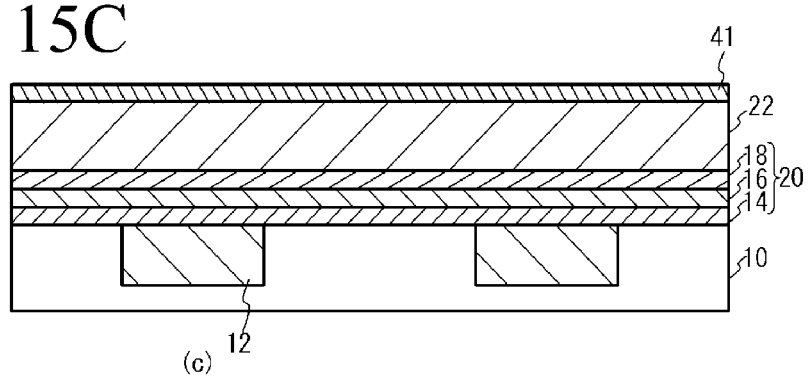
Figure 15D:
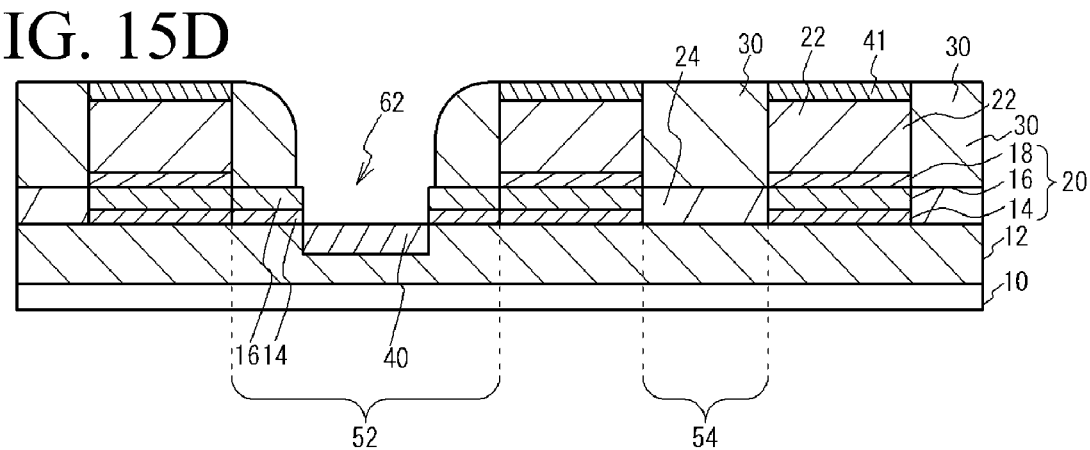

Referring now to FIG. 8A through FIG. 15D, a method of manufacturing the flash memory in accordance with the third embodiment is described. FIG. 8A, FIG. 9A, FIG. 10A, FIG. 11A, FIG. 12A, FIG. 13A, FIG. 14A, and FIG. 15A are cross-sectional views, taken along the line A-A of FIG. 6, or are cross-sectional views of a first inter-wordline region 54 (a first region) between two word lines 22 where the metal plugs 32 are not to be formed. FIG. 8B, FIG. 9B, FIG. 10B, FIG. 11B, FIG. 12B, FIG. 13B, FIG. 14B, and FIG. 15B are cross-sectional views, taken along the line B-B of FIG. 6, or are cross-sectional views of a second inter-wordline region 52 (a second region) between two word lines 22 where the metal plugs 32 to be connected to the bit lines 12 are to be formed. FIG. 8C, FIG. 9C, FIG. 10C, FIG. 11C, FIG. 12C, FIG. 13C, FIG. 14C, and FIG. 15C are cross-sectional views, taken along the line C-C of FIG. 6. FIG. 14D and FIG. 15D are cross-sectional views, taken along the line E-E of FIG. 6.

Figure 8A:
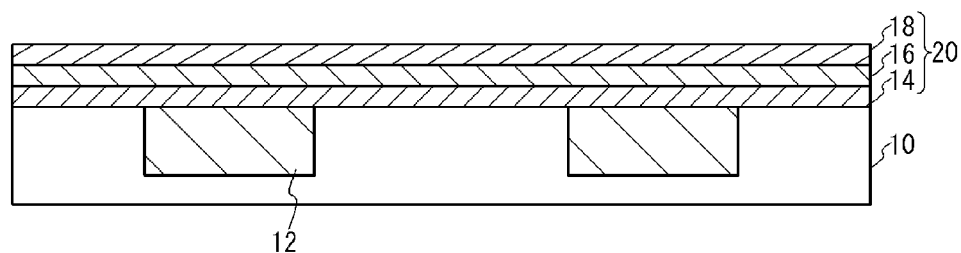
FIGS. 8A through 8C are cross-sectional views illustrating a first procedure in a process for manufacturing the flash memory of FIG. 6 in accordance with the third embodiment of the present invention.
Figure 8B:
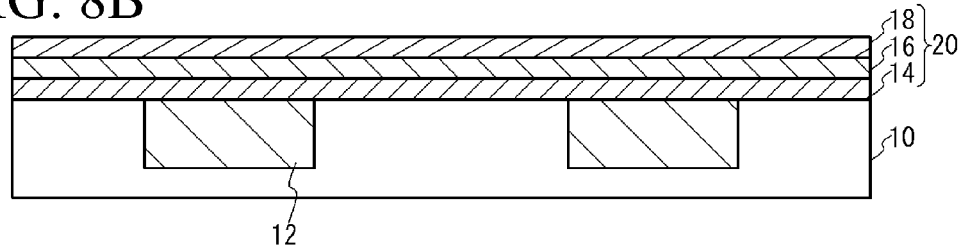
Figure 8C:
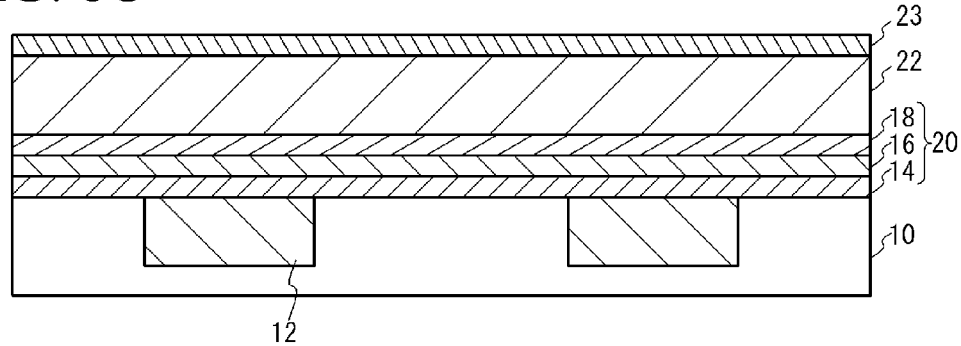
Figure 9A:
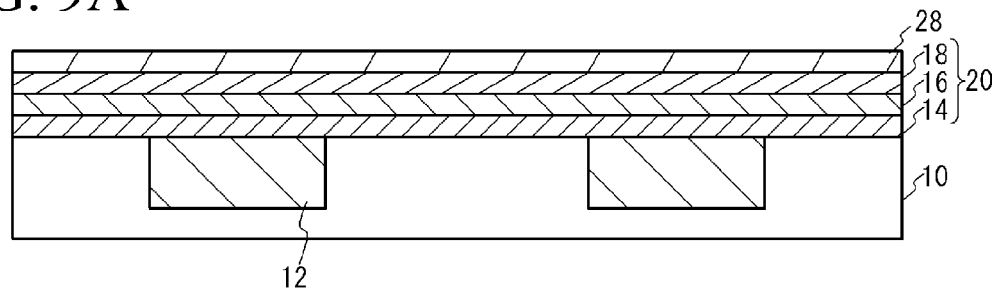
FIGS. 9A through 9C are cross-sectional views illustrating a second procedure in the process for manufacturing the flash memory of FIG. 6 in accordance with the third embodiment.
Figure 9B:
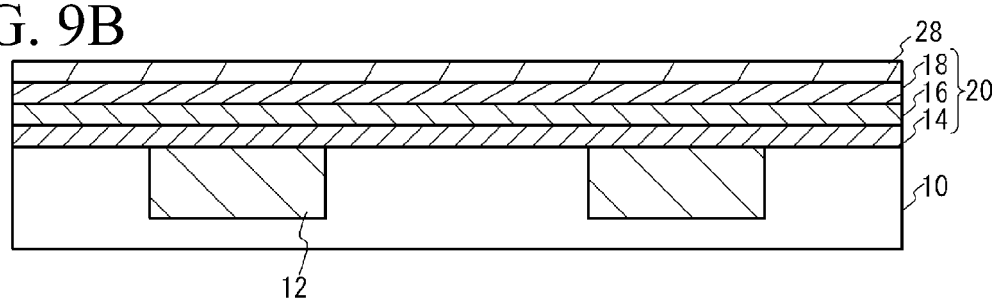
Figure 9C:
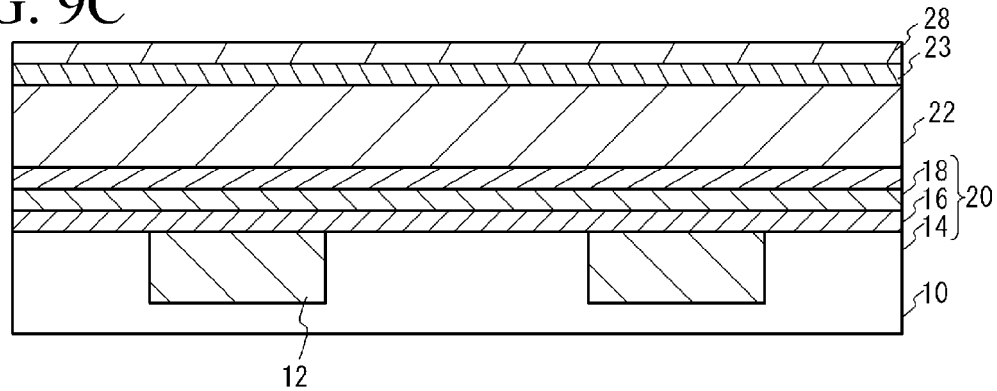
Figure 10A:
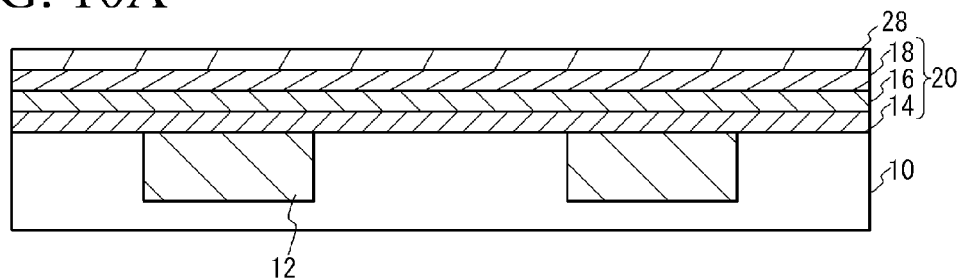
FIGS. 10A through 10C are cross-sectional views illustrating a third procedure in the process for manufacturing the flash memory of FIG. 6 in accordance with the third embodiment.
Figure 10B:
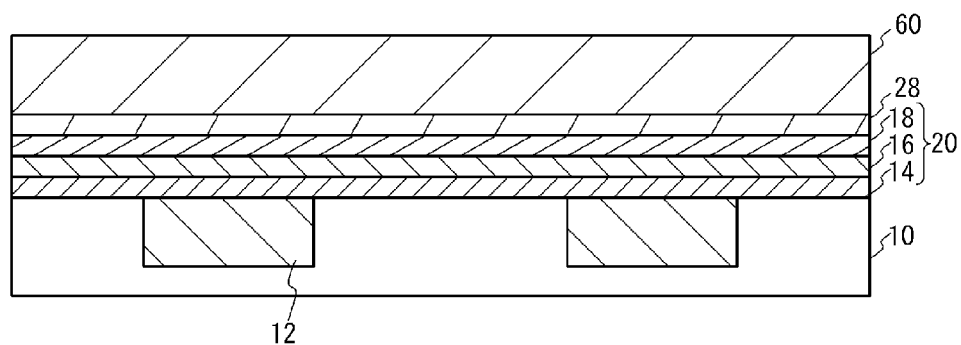
Figure 10C:
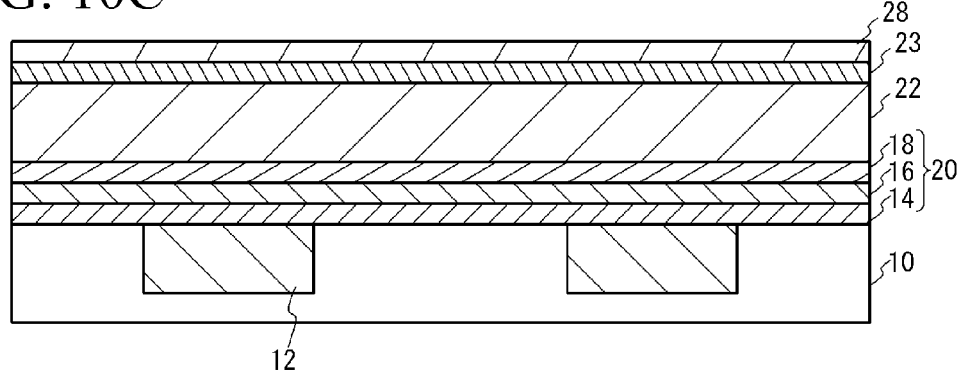
Figure 11A:
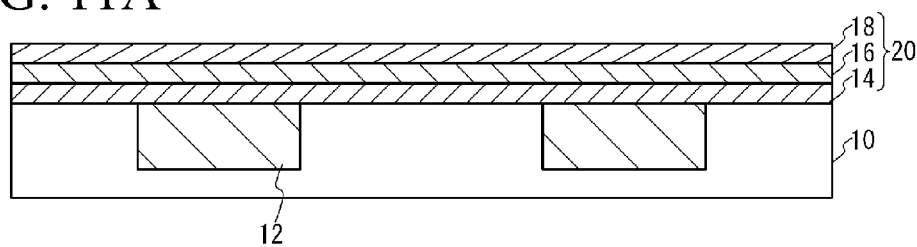
FIGS. 11A through 11C are cross-sectional views illustrating a fourth procedure in the process for manufacturing the flash memory of FIG. 6 in accordance with the third embodiment.
Figure 11B:
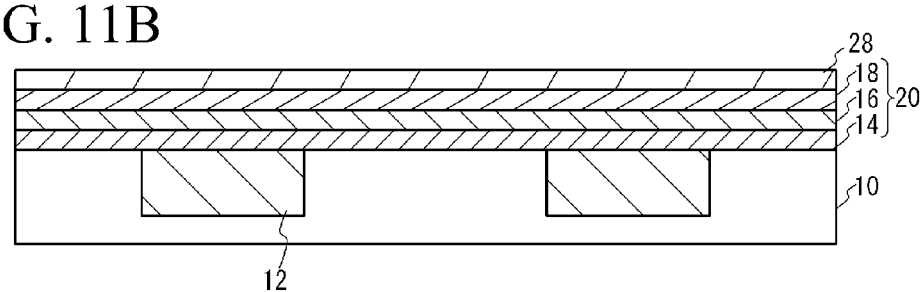
Figure 11C:
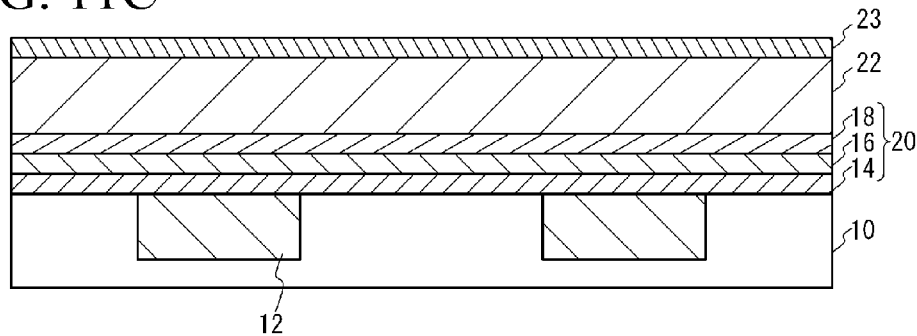

As shown in FIG. 8A through FIG. 8C, the same manufacturing procedures of the first embodiment shown in FIG. 3A through FIG. 3D are carried out. A silicon oxide film 23 is formed on each word line 22. As shown in FIG. 9A through FIG. 9C, a first silicon nitride film 28 is formed on the word lines 22 and on the ONO films 20 between the word lines 22. As shown in FIG. 10A through FIG. 10C, a photoresist 60 is formed on the ONO film 20 in each of the second inter-wordline regions 52. Here, openings are formed in the photoresist 60, so that the photoresist 60 is not formed on the word lines 22 and on the portions of the ONO film 20 in the first inter-wordline regions 54. As shown in FIG. 11A through FIG. 11C, with the photoresist 60 serving as a mask, the first silicon nitride film 28 on the word lines 22 and on the portions of the ONO films 20 in the first inter-wordline regions 54 are removed. The photoresist 60 is then removed.

Figure 12A:
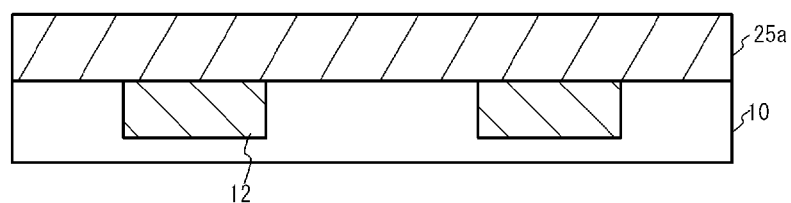
FIGS. 12A through 12C are cross-sectional views illustrating a fifth procedure in the process for manufacturing the flash memory of FIG. 6 in accordance with the third embodiment.
Figure 12B:
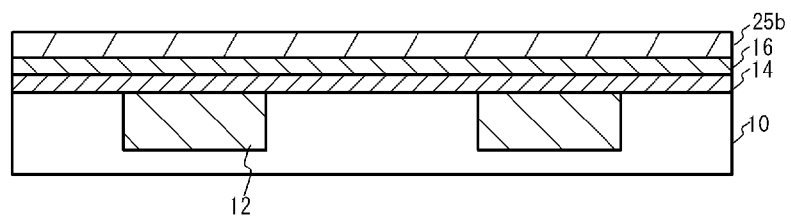
Figure 12C:
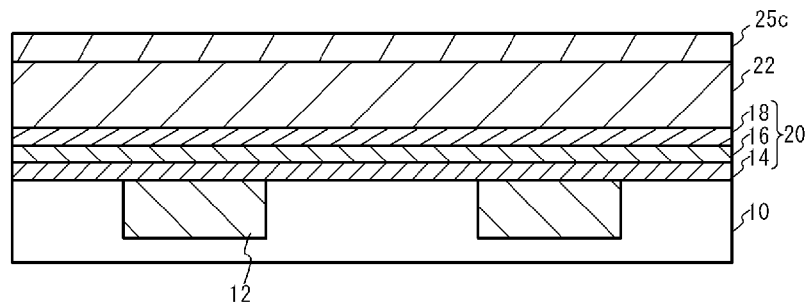

As shown in FIG. 12A through FIG. 12C, thermal oxidation is performed. Through the thermal oxidation, the portion of the trapping layer 16 in each of the first inter-wordline regions 54 is oxidized. As a result, the tunnel oxide films 14, the layers formed from the oxidized portions of the trapping layers 16, and the top oxide films 18 form silicon oxide films 25a. Also, as shown in FIG. 12B, the first silicon nitride film 28 in each of the second inter-wordline regions 52 is oxidized. Here, the trapping layers 16 are not oxidized. As a result, the oxide films formed from the oxidized first silicon nitride film 28 and the top oxide films 18 form silicon oxide films 25b. As shown in FIG. 12C, the upper portion of each word line 22 is oxidized. As a result, the silicon oxide films 23 and the layer formed from the oxidized upper portions of the word lines 22 form silicon oxide films 25c. Here, the silicon oxide films 25a are thicker than the silicon oxide films 25b and 25c.

As shown in FIG. 13A through 13C, etching is performed on the entire surfaces of the silicon oxide films 25a, 25b, and 25c. Through the etching, the portions of the silicon oxide films 25b and 25c located on the trapping layers 16 and on the word lines 22 are completely removed. Since the silicon oxide films 25a are thicker than the silicon oxide films 25b and 25c, the silicon oxide films 25a remains in the first inter-wordline regions 54 on the semiconductor substrate 10, so as to form the silicon oxide layers 24, as shown in FIG. 13A.

As shown in FIG. 14A through 14D, the second silicon nitride film 30 is formed on the silicon oxide layers 24, the trapping layers 16, and the word lines 22 by high-density plasma CVD, for example. Etching is then performed on the entire surface. As shown in FIG. 14A and FIG. 14D, in each of the second inter-wordline regions 52, the distance between the two word lines 22 is sufficiently long. Accordingly, the second silicon nitride film 30 remains as sidewalls at the side portions of the word lines 22, and the rest of the second silicon nitride film 30 is removed. Meanwhile, as shown in FIG. 14B and FIG. 14D, in each of the first inter-wordline regions 54, the distance between the two word lines 22 is sufficiently short, the second silicon nitride film 30 remains on the silicon oxide layers 24. As shown in FIG. 14C and FIG. 14D, the portions of the second silicon nitride film 30 located on the word lines 22 are removed.

As shown in FIG. 15A through 15D, the openings 62 are formed in the tunnel oxide film 14 and the trapping layer 16 on each bit line 12 in each of the second inter-wordline regions 52, as in FIG. 15B and FIG. 15D. A cobalt film or a titanium film is then formed on the entire surface by a sputtering technique, and heat treatment is carried out. Through this procedure, the metal silicide layers 40 and 41 are formed in each of the bit lines 12 below the openings 62 and on each of the word lines 22. The non-silicided portions of the cobalt or titanium film are removed. As the metal silicide layers 40 are brought into contact with the semiconductor substrate, a junction current flows between the semiconductor substrate 10 and the bit lines 12 via the metal silicide layers 40. Therefore, the metal silicide layers 40 are designed not to be in contact with the portions of the semiconductor substrate 10 located between the bit lines 12.

As shown in FIG. 7A through FIG. 7D, a silicon oxide film, for example, is formed as the interlayer insulating film 34 on the second silicon nitride films 30, the word lines 22, and the metal silicide layers 40. The contact holes connecting to the metal silicide layers 40 are then formed in the interlayer insulating film 34. The buried metal plugs 32 made of W, for example, are formed in the contact holes. The wiring layers 36 that extend in the extending direction of the bit lines 12 are formed on the interlayer insulating film 34. The protection film 38 is then formed over the wiring layers 36.

In the third embodiment, the first silicon nitride film 28 is formed on the ONO films 20 and the word lines 22, as shown in FIG. 9A through FIG. 9C. As shown in FIG. 11A, the portions of the first silicon nitride film 28 located in the first inter-wordline regions 54 (the first regions) are removed. As shown in FIG. 12A and FIG. 12B, the portions of the first silicon nitride film 28 located in the second inter-wordline regions 52 (the second regions) and the portions of the trapping layer 16 of the ONO film 20 located in the first inter-wordline regions 54 are oxidized. Through those procedures, the trapping layers 16 can remain in the second inter-wordline regions 52.

As shown in FIG. 13B, the silicon oxide films 25b formed from the oxidized portions of the first silicon nitride film 28 are removed from the second inter-wordline regions 52, so as to expose the trapping layers 16 of the ONO films 20. In this manner, the trapping layers 16 are exposed through the surfaces of the second inter-wordline regions 52. With this arrangement, the trapping layers 16 continually exist in the regions between the word lines 22 where the metal plugs 32 are provided, and silicon oxide layers are provided between the trapping layers 16 in the regions between the word lines 22 where the metal plugs are not provided. As shown in FIG. 14A and FIG. 14D, the second silicon nitride films 30 is formed on the silicon oxide layers 24 in the first inter-wordline regions 54. Accordingly, each of the first inter-wordline regions 54 can be covered with the second silicon nitride film 30 that is different from the trapping layers 16 of the first silicon nitride film. As shown in FIGS. 15B and 15D, the metal silicide layers 40 are formed on the bit lines 12 where the metal plugs 32 are to be formed. Here, the surfaces of the second inter-wordline regions 52 are covered with the trapping layers 16 that are silicon nitride films, and the surfaces of the first inter-wordline regions 54 are covered with the second silicon nitride films 30 formed on the silicon oxide layers 24. When silicidation is performed in a situation where the uppermost face is a silicon oxide film, the silicon oxide film is silicided, and electric short-circuiting might be caused between the word lines 22. In accordance with the third embodiment, however, the surfaces of the second inter-wordline regions 52 and the first inter-wordline regions 54 are covered with silicon nitride films. Since the surfaces of the silicon nitride films are not easily silicided, silicidation of the surfaces of the insulating films can be prevented.

The second silicon nitride films 30 (the silicon nitride films in the regions between the word lines 22 where the metal plugs 32 are not provided) are thicker than the trapping layers 16 (the silicon nitride films in the regions between the word lines 22 where the metal plugs 32 are provided). Other than the function of restraining silicidation, the second silicon nitride films 30 also have the function of flattening the first inter-wordline regions 54, so as to facilitate the formation of the interlayer insulating film 34, as shown in FIG. 7D. Therefore, the second silicon nitride films 30 should preferably have the same film thickness as the word lines 22. Meanwhile, the openings 62 are formed in the trapping layers 16 in the second inter-wordline regions 52, as shown in FIG. 15B and FIG. 15D. Therefore, the trapping layers 16 should preferably be thin enough to facilitate etching.

Fourth Embodiment

A fourth embodiment of the present invention is an example case where metal silicide layers to be connected to contact holes are formed on the bit lines 12 of the same flash memory as the flash memory of the second embodiment. Referring to FIG. 16A through FIG. 20C, a method of manufacturing the flash memory in accordance with the fourth embodiment is described. FIG. 16A, FIG. 17A, FIG. 18A, FIG. 19A, and FIG. 20A are equivalent to cross-sectional views taken along the line A-A of FIG. 6, or are cross-sectional views of a first inter-wordline region 54 between word lines 22 where metal plugs 32 are not to be formed. FIG. 16B, FIG. 17B, FIG. 18B, FIG. 19B, and FIG. 20B are equivalent to cross-sectional views taken along the line B-B of FIG. 6, or are cross-sectional views of a second inter-wordline region 52 between word lines 22 where metal plugs 32 are be formed. FIG. 16C, FIG. 17C, FIG. 18C, FIG. 19C, and FIG. 20C are equivalent to cross-sectional views taken along the line C-C of FIG. 6.

Figure 16A:
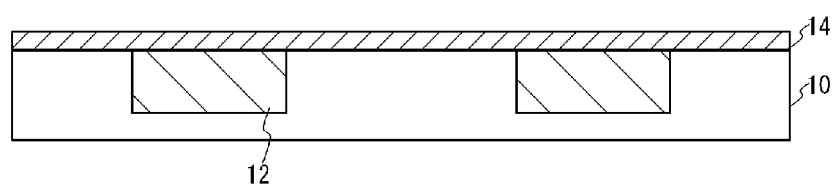
FIGS. 16A through 16C are cross-sectional views illustrating a first procedure in a process for manufacturing a flash memory in accordance with a fourth embodiment of the present invention.
Figure 16B:
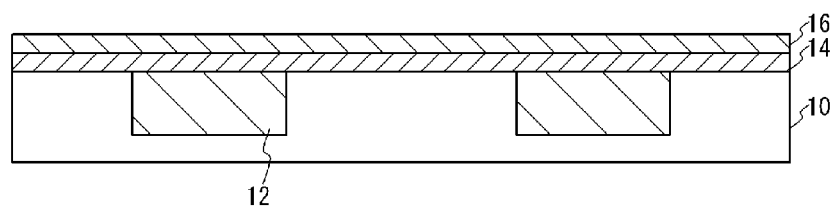
Figure 16C:
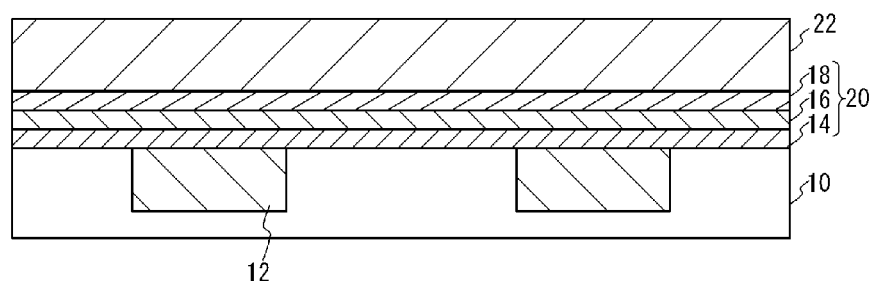

As shown in FIG. 16A through 16C, after the same manufacturing procedures as the procedures of the third embodiment shown in FIG. 8A through 11C are carried out, the top oxide films 18 in the first inter-wordline regions 54 and the silicon oxide films 23 on the word lines 22 are removed. Here, selective etching is performed on the silicon oxide films as opposed to the silicon nitride films, so that the first silicon nitride films 28 in the second inter-wordline regions 52 remain. The trapping layers 16 in the first inter-wordline regions 54 and the first silicon nitride films 28 in the second inter-wordline regions 52 are then removed. Here, selective etching is performed on the silicon nitride films as opposed to the silicon oxide films, so that the tunnel oxide films 14 in the first inter-wordline regions 54 and the top oxide films 18 in the second inter-wordline regions 52 remain in the structure.

Figure 17A:
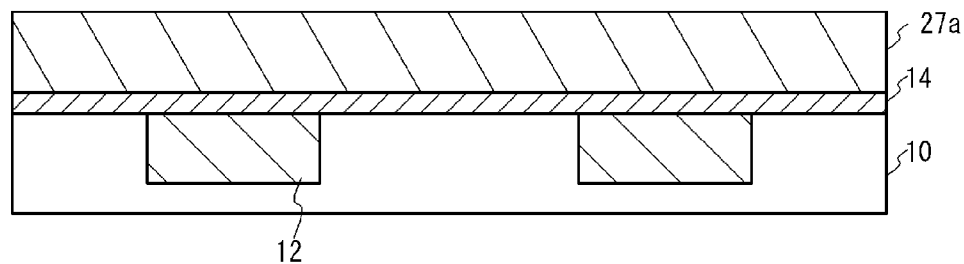
FIGS. 17A through 17C are cross-sectional views illustrating a second procedure in the process for manufacturing the flash memory in accordance with the fourth embodiment.
Figure 17B:
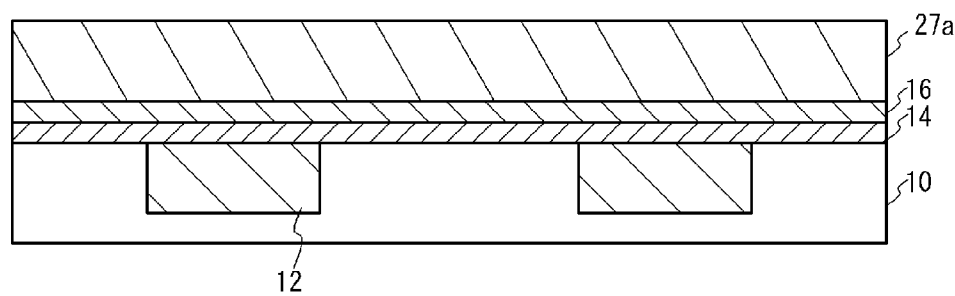
Figure 17C:
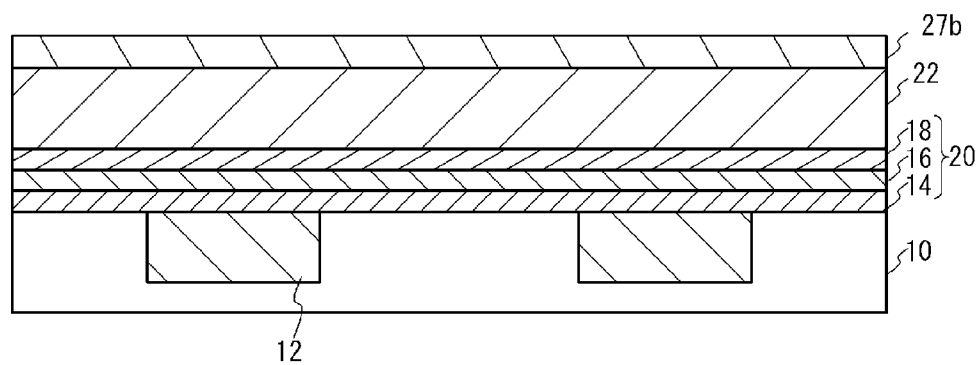
Figure 18A:
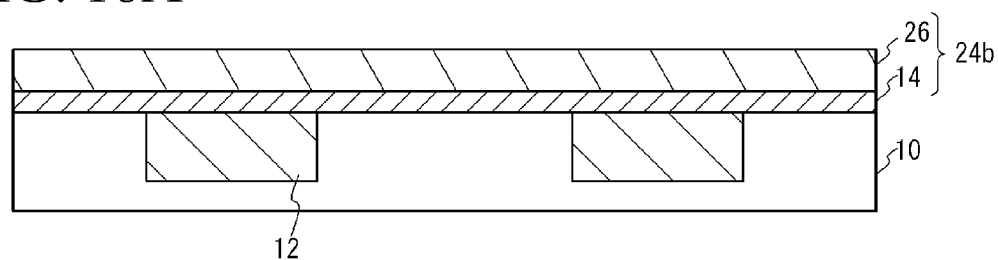
FIGS. 18A through 18C are cross-sectional views illustrating a third procedure in the process for manufacturing the flash memory in accordance with the fourth embodiment.
Figure 18B:
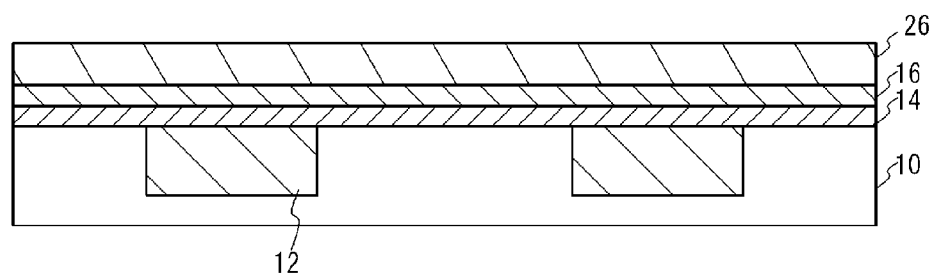
Figure 18C:
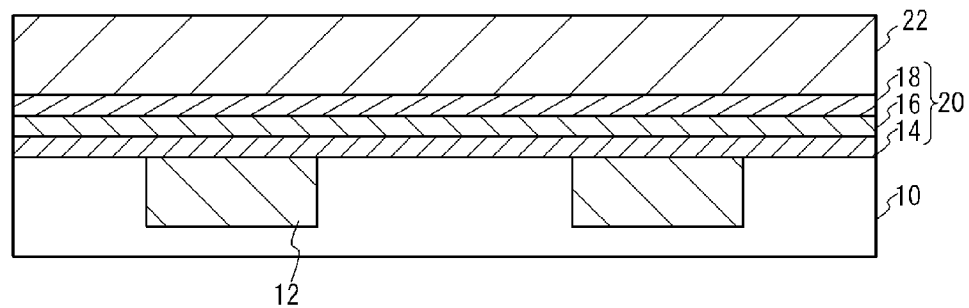

As shown in FIG. 17A through FIG. 17C, HSQ (Hydrogen Silesquioxane) is then applied and heated so as to form silicon oxide films 27a and 27b. As the HSQ film is flattened, the silicon oxide films 27a in the first inter-wordline regions 54 and the second inter-word line regions 52 shown in FIG. 17A and FIG. 17B become thick, while the silicon oxide films 27b on the word lines 22 shown in FIG. 17C become thin. As shown in FIG. 18A through FIG. 18C, etching is performed on the entire surfaces of the silicon oxide films 27a and 27b, so as to remove the silicon oxide films 27b on the word lines 22, as shown in FIG. 18C. Since the film thickness of each silicon oxide film 27a is greater than the film thickness of each silicon oxide film 27b, the silicon oxide films 27 in the first inter-wordline regions 54 and the second inter-wordline regions 52 remain to be silicon oxide films 26, as shown in FIG. 18A and FIG. 18B. As shown in FIG. 18A, in the first inter-wordline regions 54, the silicon oxide films 26 and the tunnel oxide films 14 form silicon oxide layers 24b.

Figure 19A:
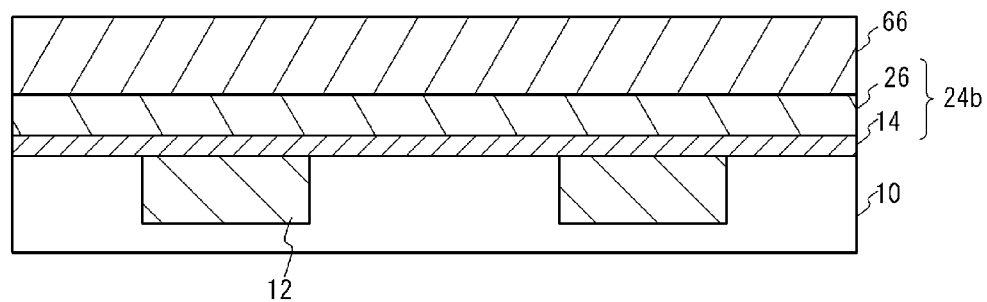
FIGS. 19A through 19C are cross-sectional views illustrating a fourth procedure in the process for manufacturing the flash memory in accordance with the fourth embodiment.
Figure 19B:
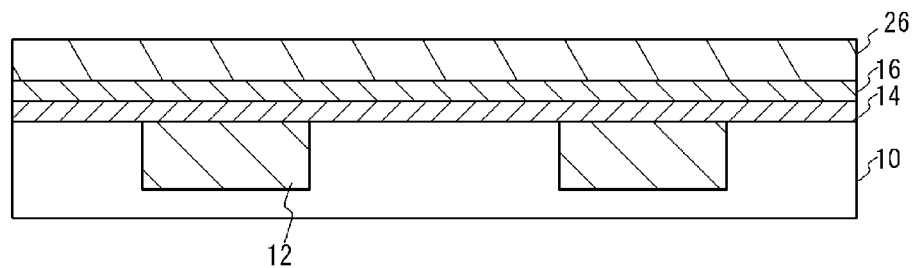
Figure 19C:
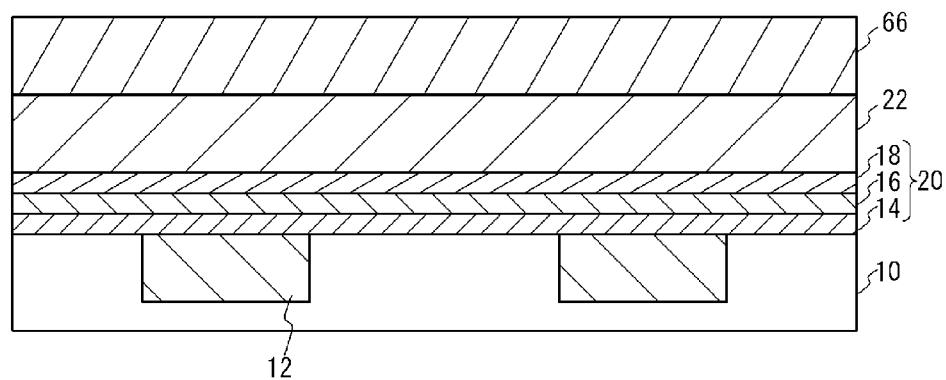
Figure 20A:
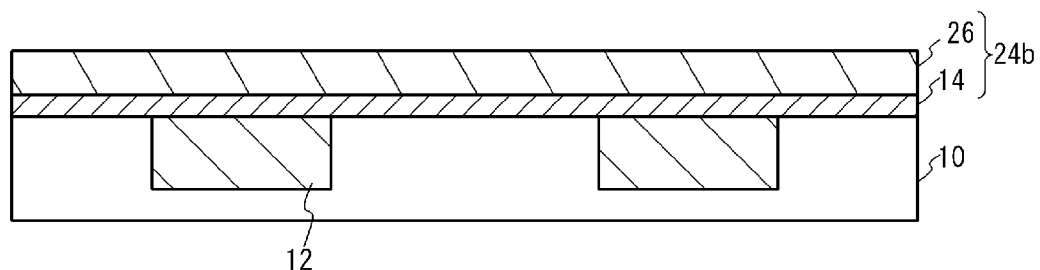
FIGS. 20A through 20C are cross-sectional views illustrating a fifth procedure in the process for manufacturing the flash memory in accordance with the fourth embodiment.
Figure 20B:
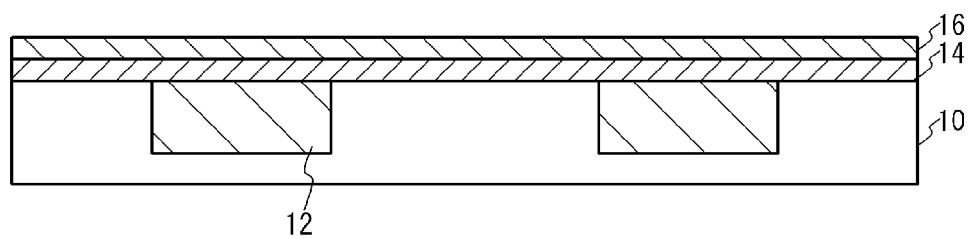
Figure 20C:
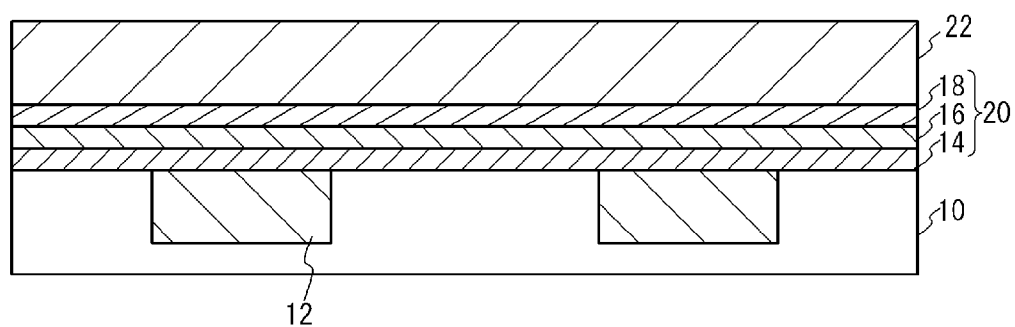

As shown in FIG. 19A through FIG. 19C, a photoresist 66 is formed over the silicon oxide films 26 in the first inter-wordline regions 54 and on the word lines 22, but the photoresist 66 is not formed in the second inter-wordline regions 52. Referring now to FIG. 20A through FIG. 20C, the silicon oxide films 26 in the second inter-wordline regions 52 are removed as shown in FIG. 20B. Accordingly, the trapping layers 16 are exposed through the surfaces of the second inter-wordline regions 52, as shown in FIG. 20B. As shown in FIG. 20A, in the first inter-wordline regions 54, the silicon oxide films 26 are formed on the tunnel oxide films 14. The tunnel oxide films 14 and the silicon oxide films 26 form the silicon oxide layers 24b. The procedures of the third embodiment shown in FIG. 14A through FIG. 15D are then carried out to complete the flash memory in accordance with the fourth embodiment.

In the fourth embodiment, as described in the third embodiment with reference to FIG. 9A through FIG. 9C, the first silicon nitride films 28 are formed on the ONO films 20 and the word lines 22. As described in the third embodiment with reference to FIG. 11A, the first silicon nitride films 28 in the first inter-wordline regions 54 are then removed. As shown in FIG. 16A and FIG. 16B, the first silicon nitride films 28 in the second inter-wordline regions 52 and the trapping layers 16 in the first inter-wordline regions 54 are removed in one procedure. Through those procedures, the trapping layers 16 can remain in the second inter-wordline regions 52.

As shown in FIG. 18A and FIG. 18B, the silicon oxide films 26 are formed on the portions of the semiconductor substrate 10 located in the second inter-wordline regions 52 and the first inter-wordline regions 54. As shown in FIG. 20B, the silicon oxide films 26 in the second inter-wordline regions 52 are removed, so as to expose the trapping layers 16 of the ONO films 20. In this manner, the trapping layers 16 are exposed in the second inter-wordline regions 52.

In accordance with the fourth embodiment, the end portions of the trapping layers 16 below the word lines 22 are not oxidized, as in the second embodiment. Accordingly, the charge storing regions can be prevented from becoming smaller. Also, as in the third embodiment, when the metal silicide layers 40 are formed, silicidation of the surfaces of the insulating films between the word lines 22 can be prevented.

Finally, several aspects of the present invention are summarized below.

According to an aspect of the present invention, there is provided a semiconductor device including: ONO films that are formed on a semiconductor substrate and include trapping layers; word lines that are formed on the ONO films; and silicon oxide layers that are formed at portions on the semiconductor substrate, the portions being located between the word lines, the silicon oxide layers being located between the trapping layers. According to this aspect, silicon oxide layers are formed on both sides of the trapping layers below the word lines. Accordingly, the formation of charge storing regions on the sides of the word lines due to a fringing current can be prevented. Also, since the silicon oxide layers are formed between the word lines, the formation of silicon oxynitride films can be prevented.

The semiconductor device may further include silicon nitride layers formed on the silicon oxide layers.

The semiconductor device may further include: bit lines that are provided in the semiconductor substrate; and metal plugs that are connected to the bit lines in regions between the word lines, wherein the trapping layers are continually formed in the regions between the word lines where the metal plugs are provided, and wherein the silicon oxide films are provided between the trapping layers in regions between the word lines where the metal plugs are not provided.

The semiconductor device may further include metal silicide layers that are formed between the bit lines and the metal plugs. With this structure, silicidation of the surfaces of the insulating films between the word lines when the metal silicide layers are formed can be prevented.

According to another aspect of the present invention, there is provided a method of manufacturing a semiconductor device including: forming ONO films that include trapping layers on a semiconductor substrate; forming word lines on the ONO films; and forming silicon oxide layers by oxidizing portions of the trapping layers, the portions being located between the word lines. In accordance with this invention, silicon oxide layers are formed on both sides of the trapping layers below the word lines. Accordingly, the formation of charge storing regions on the sides of the word lines due to a fringing current can be prevented. Also, since the silicon oxide layers are formed between the word lines, the formation of silicon oxynitride films can be prevented. Furthermore, the silicon oxide layers can be formed through a simple procedure.

The method may further include: forming bit lines in the semiconductor substrate; forming first silicon nitride films on the ONO films and the word lines; and removing the first silicon nitride films in first regions that are regions located between the word lines, metal plugs being not to be formed in the first regions, the metal plugs being connected to the bit lines, wherein forming the silicon oxide layers includes oxidizing the first silicon nitride films in second regions and the trapping layers in the first regions, the second regions being regions located between the word lines, the metal plugs being to be formed in the second regions. In this structure, the trapping layers can remain in the second region.

The method may further include exposing the trapping layers by removing layers that are formed by oxidizing the first silicon nitride films in the second regions, or may further include forming second silicon nitride films on the silicon oxide layers in the first regions.

The method may further include forming metal silicide layers on the bit lines in the second regions. In this structure, the surfaces of the second region and the first region are covered with silicon nitride films. As the surfaces of the silicon nitride films are not easily silicided, silicidation of the surfaces of the insulating films in the second region and the first region can be prevented when the metal silicide layers are formed.

According to yet another aspect of the present invention, there is provided a method of manufacturing a semiconductor device, including: forming ONO films that include trapping layers on a semiconductor substrate; forming word lines on the ONO films; removing portions of the trapping layers, the portions being located between the word lines; and forming silicon oxide layers on portions of the semiconductor substrate, the portions being located between the word lines. According to this aspect of the present invention, silicon oxide layers are formed on both sides of the trapping layers below the word lines. Accordingly, the formation of charge storing regions on the sides of the word lines due to a fringing current can be prevented. Also, since the silicon oxide layers are formed between the word lines, the formation of silicon oxynitride films can be prevented. Furthermore, the end portions of the trapping layers located below the word lines cannot be oxidized. Thus, the charge storing regions cannot be made smaller.

The method may further include: forming bit lines in the semiconductor substrate; forming first silicon nitride films on the ONO films and the word lines; and removing the first silicon nitride films in first regions that are regions located between the word lines, metal plugs being not to be formed in the first regions, the metal plugs being connected to the bit lines, wherein removing the trapping layers includes removing the first silicon nitride films in second regions and the trapping layers in the first regions, the second regions being regions located between the word lines where the metal plugs are to be formed. In this structure, the trapping layers can remain in the second region.

The method may further include exposing the trapping layers of the ONO films by removing the silicon oxide layers in the second regions, or may further include forming second silicon nitride films on the silicon oxide layers in the first regions.

The method may further include forming metal silicide layers on the bit lines in the second regions. In this structure, silicidation of the surfaces of the insulating films in the second region and the first region can be prevented when the metal silicide layers are formed.

As described above, this invention can provide a semiconductor device and a method of manufacturing the semiconductor device, by which the formation of charge storing regions on the sides of the word lines and the formation of silicon oxynitride films between the word lines can be prevented.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2006-353416 filed on Dec. 27, 2006, the entire disclosure of which is hereby incorporated by reference.

The invention claimed is:

1. A semiconductor device comprising:
   ONO films formed on a semiconductor substrate and including trapping layers;
   word lines formed on the ONO films wherein the top surfaces of the ONO films accommodate the entire bottom surfaces of the word lines; and
   silicon oxide layers formed on portions of the semiconductor substrate, the portions being located between the word lines, the silicon oxide layers being located between the trapping layers of the ONO films below the word lines;
   bit lines provided in the semiconductor substrate; and
   metal plugs connected to the bit lines at regions between the word lines, wherein the trapping layers are continuously formed in the regions between the word lines where the metal plugs are provided, and
   wherein the silicon oxide layers are provided between the trapping layers in the regions between the word lines where the metal plugs are not provided.

2. The semiconductor device in accordance with claim 1, further comprising silicon nitride layers formed on the silicon oxide layers.

3. The semiconductor device in accordance with claim 1, further comprising metal silicide layers formed between the bit lines and the metal plugs.

4. A method for manufacturing a semiconductor device comprising:
   forming ONO films on a semiconductor substrate, the ONO films including trapping layers;
   forming word lines on the ONO films wherein the top surfaces of the ONO films accommodate the entire bottom surfaces of the word lines;
   forming silicon oxide layers by oxidizing portions of the trapping layers located between the word lines;
   forming bit lines in the semiconductor substrate;
   forming first silicon nitride films on the ONO films and the word lines; and
   removing the first silicon nitride films in first regions, the first regions located between the word lines and defined as regions where metal plugs connected to the bit lines are not to be formed, and
   wherein forming the silicon oxide layers includes oxidizing the trapping layers in the first regions and oxidizing the first silicon nitride films in second regions, the second regions located between the word lines and defined as regions where the metal plugs are to be formed.

5. The method in accordance with claim 4, further comprising forming metal silicide layers on the bit lines in the second regions.

6. A method for manufacturing a semiconductor device comprising the steps of:
   forming ONO films that include trapping layers on a semiconductor substrate;
   forming word lines on the ONO films wherein the top surfaces of the ONO films accommodate the entire bottom surfaces of the word lines;
   removing portions of the trapping layers located between the word lines; and
   forming silicon oxide layers on portions of the semiconductor substrate located between the word lines where the portions of the trapping layers have been removed;
   forming bit lines in the semiconductor substrate;
   forming first silicon nitride films on the ONO films and the word lines; and
   removing the first silicon nitride films in first regions, the first regions located between the word lines and defined as regions where metal plugs connected to the bit lines are not to be formed,
   wherein removing the trapping layers includes removing the trapping layers in the first regions and removing the first silicon nitride films in second regions, the second regions located between the word lines and defined as regions where the metal plugs are to be formed.

* * * * *